US007777321B2

(12) United States Patent
Gann et al.

(10) Patent No.: US 7,777,321 B2
(45) Date of Patent: Aug. 17, 2010

(54) STACKED MICROELECTRONIC LAYER AND MODULE WITH THREE-AXIS CHANNEL T-CONNECTS

(76) Inventors: Keith D. Gann, 2370 Burnham Dr., Tustin, CA (US) 92782; W. Eric Boyd, 39 Albergar, San Clemente, CA (US) 92672

( * ) Notice: Subject to any disclaimer, the term of this patent is extended or adjusted under 35 U.S.C. 154(b) by 274 days.

(21) Appl. No.: 11/259,683

(22) Filed: Oct. 25, 2005

(65) Prior Publication Data
US 2006/0043563 A1    Mar. 2, 2006

Related U.S. Application Data

(63) Continuation-in-part of application No. 11/062,507, filed on Feb. 22, 2005, now Pat. No. 7,511,369, which is a continuation-in-part of application No. 10/968,572, filed on Oct. 19, 2004, which is a continuation of application No. 10/128,728, filed on Apr. 22, 2002, now Pat. No. 6,806,559.

(60) Provisional application No. 60/546,598, filed on Feb. 20, 2004, provisional application No. 60/710,717, filed on Aug. 24, 2005.

(51) Int. Cl.
*H01L 23/495* (2006.01)
(52) U.S. Cl. ............... 257/686; 257/698; 257/E23.061; 257/E25.027
(58) Field of Classification Search ........... 257/686, 257/693, 698, E23.06, E23.061, E23.143, 257/E25.027
See application file for complete search history.

(56) References Cited

U.S. PATENT DOCUMENTS

| 3,370,203 | A | | 2/1968 | Kravitz et al. |
| 4,288,841 | A | * | 9/1981 | Gogal ........................ 361/792 |
| 4,706,166 | A | | 11/1987 | Go |
| 4,764,846 | A | | 8/1988 | Go |
| 5,104,820 | A | | 4/1992 | Go |
| 5,107,586 | A | | 4/1992 | Eichelberger et al. |
| 5,281,852 | A | | 1/1994 | Normington |

(Continued)

FOREIGN PATENT DOCUMENTS

EP        644547        3/1995

(Continued)

OTHER PUBLICATIONS

EP Communication for EP Application No. 03 721 978.9 dated Jul. 17, 2009.

(Continued)

*Primary Examiner*—Minh-Loan T Tran
*Assistant Examiner*—W. Wendy Kuo

(57) ABSTRACT

A method for interconnecting stacked layers containing integrated circuit die and a device built from the method is disclosed. The stacked layers are bonded together to form a module whereby individual I/O pads of the integrated circuit die are rerouted to at least one edge of the module. The rerouted leads terminate at the edge. Channels are formed in a surface of the module or on the surface of a layer whereby the rerouted leads are disposed within the channel. The entire surface of the edge or layer is metalized and a predetermined portion of the metalization removed such that the rerouted leads within each channel are electrically connected to each other.

23 Claims, 2 Drawing Sheets

U.S. PATENT DOCUMENTS

| | | | |
|---|---|---|---|
| 5,400,281 | A | 3/1995 | Val |
| 5,424,920 | A | 6/1995 | Miyake |
| 5,608,265 | A | 3/1997 | Kitano et al. |
| 5,677,566 | A | 10/1997 | King et al. |
| 5,801,448 | A | 9/1998 | Ball |
| 5,834,832 | A | 11/1998 | Kweon et al. |
| 5,835,988 | A | 11/1998 | Ishii |
| 5,857,858 | A * | 1/1999 | Gorowitz et al. ............ 439/86 |
| 5,885,850 | A | 3/1999 | Val |
| 6,072,234 | A | 6/2000 | Camien et al. |
| 6,084,175 | A | 7/2000 | Perry et al. |
| 6,172,423 | B1 | 1/2001 | Lee |
| 6,338,973 | B1 | 1/2002 | Terrill |
| 6,380,624 | B1 | 4/2002 | Hung |
| 6,486,546 | B2 | 11/2002 | Moden et al. |
| 6,528,353 | B2 | 3/2003 | Suh et al. |
| 6,545,228 | B2 | 4/2003 | Hashimoto |
| 6,560,109 | B2 | 5/2003 | Yamaguchi et al. |
| 6,611,052 | B2 | 8/2003 | Poo et al. |
| 6,627,984 | B2 * | 9/2003 | Bruce et al. ............ 257/686 |
| 6,650,013 | B2 | 11/2003 | Yin et al. |
| 6,674,161 | B1 | 1/2004 | Haba |
| 6,706,971 | B2 | 3/2004 | Albert et al. |
| 6,710,246 | B1 | 3/2004 | Mostafazadeh et al. |
| 6,784,547 | B2 | 8/2004 | Pepe et al. |
| 6,806,559 | B2 | 10/2004 | Gann et al. |
| 6,809,367 | B2 | 10/2004 | Val |
| 7,115,986 | B2 | 10/2006 | Moon et al. |
| 2001/0023980 | A1 * | 9/2001 | Ohmori ............ 257/678 |
| 2002/0066952 | A1 | 6/2002 | Taniguchi et al. |
| 2002/0096760 | A1 | 7/2002 | Simelgor et al. |
| 2003/0042595 | A1 | 3/2003 | Canella |
| 2003/0059976 | A1 * | 3/2003 | Nathan et al. ............ 438/106 |
| 2006/0076671 | A1 | 4/2006 | Kariya et al. |

FOREIGN PATENT DOCUMENTS

| | | |
|---|---|---|
| FR | 2645681 | 10/1990 |
| WO | WO 01/59841 | 8/2001 |

OTHER PUBLICATIONS

Non-final Office Action for U.S. Appl. No. 10/968,572 mailed Aug. 13, 2009.

European Search report for Application No. 05111589.7 dated Dec. 20, 2007.

International Search Report for PCT/US03/13569 completed Jun. 19, 2003.

Final Office Action issued in corresponding U.S. Appl. No. 10/968,572 mailed May 7, 2009.

Final Office Action for U.S. Appl. No. 10/968,572 mailed Jan. 28, 2010.

Non-final Office Action issued in U.S. Appl. No. 12/562,803 and mailed on Mar. 30, 2010.

* cited by examiner

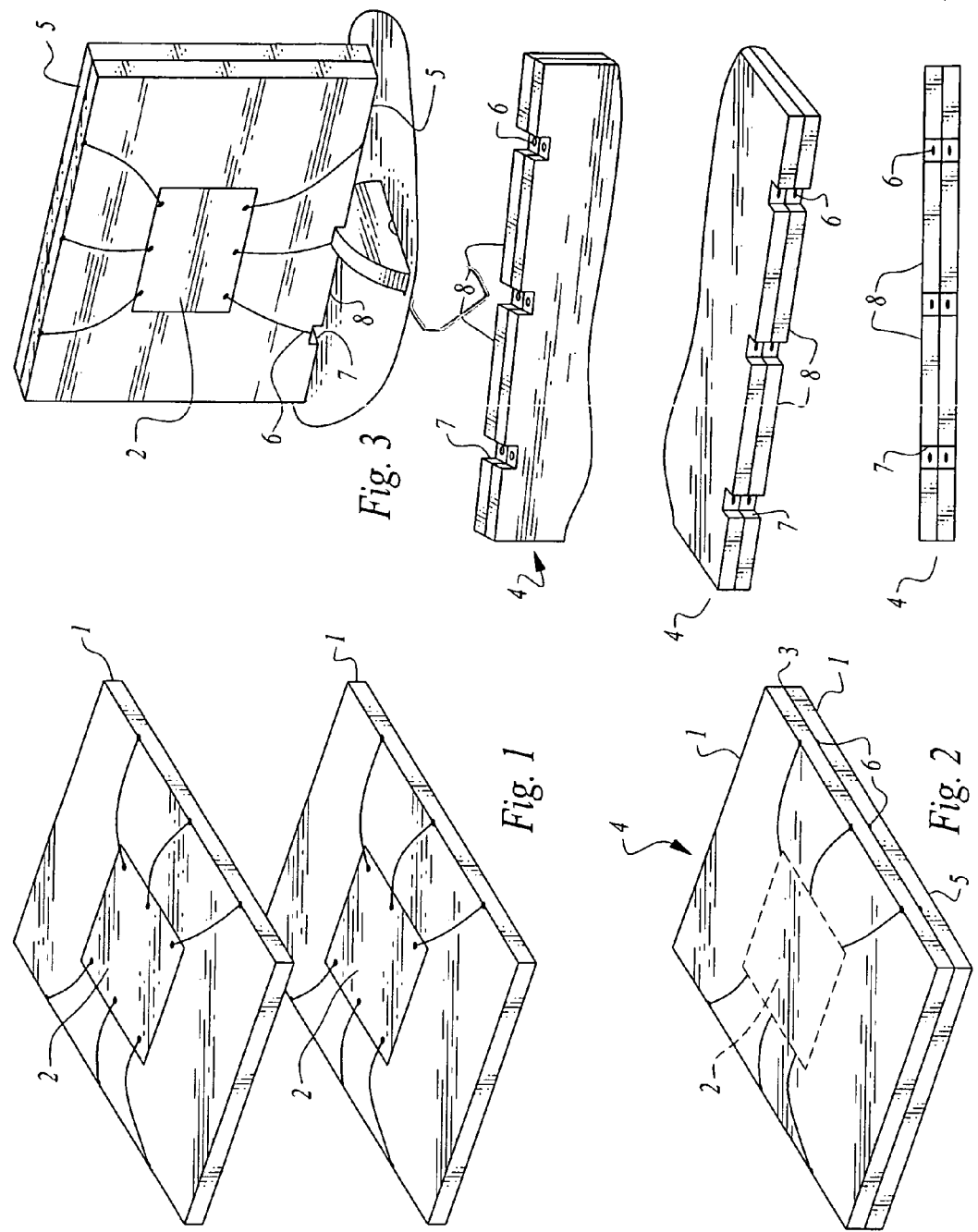

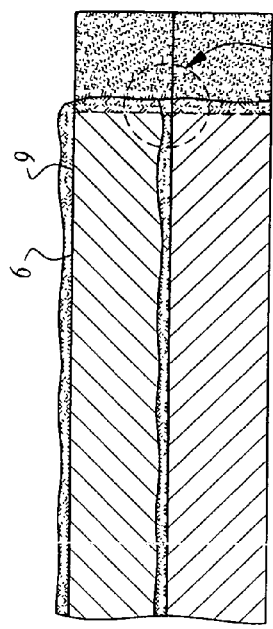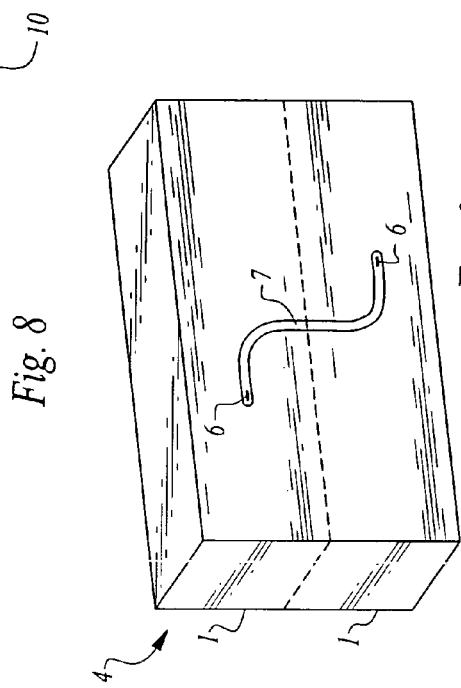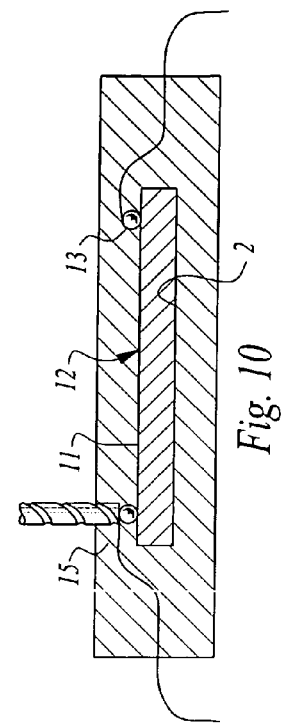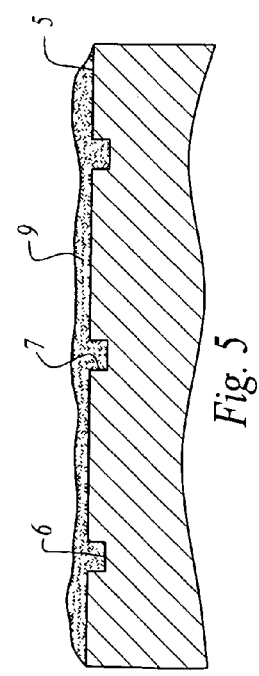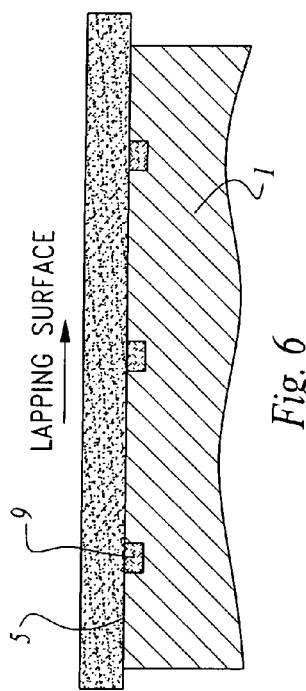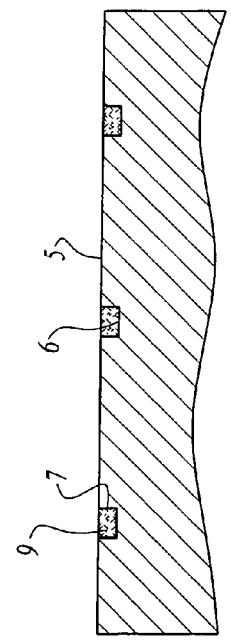

STACKED MICROELECTRONIC LAYER AND MODULE WITH THREE-AXIS CHANNEL T-CONNECTS

REFERENCE TO RELATED APPLICATION

This application is a continuation-in-part of U.S. application Ser. No. 11/062,507, filed Feb. 22, 2005, now U.S. Pat. No. 7,511,369, entitled "BGA-Scale Stacks Comprised of Layers Containing Integrated Circuit Die and a Method for Making the Same" which, in turn claims the benefit of U.S. provisional patent application No. 60/546,598, filed on Feb. 20, 2004, which is a continuation-in-part of U.S. patent application Ser. No. 10/968,572, filed Oct. 19, 2004 which, in turn is a continuation of U.S. patent application Ser. No. 10/128,728, filed Apr. 22, 2002, and issued as U.S. Pat. No. 6,806,559

This application further claims priority to U.S. provisional patent application No. 60/710,717, filed Aug. 24, 2005, entitled "Surface Trenched Stackable Layer".

STATEMENT REGARDING FEDERALLY SPONSORED RESEARCH OR DEVELOPMENT

Not applicable

BACKGROUND OF THE INVENTION

1. Field of the Invention

The present invention relates to high-density microelectronic modules. More specifically, the present invention relates to a method for electrical interconnection in a high-density microelectronic module comprised of stacked, integrated circuit-containing layers and a device incorporating same.

2. Description of the Background Art

Microelectronic products that provide high circuit density in a very small space are desirable for use in a variety of applications such as consumer electronics, wireless telecommunication devices and space and military applications. By taking advantage of the ability to stack layers containing microelectronic circuit circuitry and then interconnecting those layers, ultra-high circuit density can be achieved in a very small form factor. Examples of high-density, stacked microelectronics are illustrated in a number of U.S. patents issued to common assignee, Irvine Sensors Corp., including U.S. Pat. No. 6,072,234, to Camien, U.S. Pat. No. 6,560,109 to Yamaguchi, U.S. Pat. No. 5,104,820 to Go and U.S. Pat. No. 6,784,547 to Pepe, et al., all of which are fully incorporated herein.

Stacked microelectronic modules necessarily require the electrical interconnection of various individual I/O leads or pads of the integrated circuit die or packages contained in the individual stacked layers for the rerouting of electrical signals and power. Existing interconnection methods undesirably require complicated and expensive processes involving multiple photolithographic, plating and etching steps. In applications where the stacked microelectronic module requires the interconnection of leads that are on surfaces of the stack or of a layer, a simple, inexpensive interconnection method is desirable.

BRIEF SUMMARY OF THE INVENTION

The disclosed invention comprises a device and method where stacked microelectronic packages or layers may be easily interconnected without the need to resort to complicated, multi-step, photolithographic/plating processes.

Individual integrated circuit containing layers, such as prepackaged parts (e.g. modified or unmodified thin small outline packages or ball grid array packages) or stackable layers comprised of encapsulated integrated circuit die, which die have had the I/O and power pads rerouted to one or more edges of each layer (neo-layers), are bonded together to form a three-dimensional electronic module.

A predetermined portion of one or more surfaces of the module or layer is removed such as by saw cutting, routering or grinding, so as to expose the cross-section of the individual leads or wire ball bonds to be interconnected. A groove or channel is defined on the surface whereby the cross-section of the individual leads to be interconnected are contained within the channel and concurrently defining outwardly projecting portions (projections) on the channeled surface. Depending upon the method used to define the channels, simple or complex channel geometries can be provided.

The entire surface of the module or layer is plated with a conductive material such as by a sputtered metalization layer. The metalization layer on the projections is removed, such as by grinding or lapping. In the manner, the desired leads remain electrically interconnected within the defined channels where the interconnects are less vulnerable to damage.

BRIEF DESCRIPTION OF THE DRAWINGS

FIG. 1 is a perspective view of two stackable layers prior to bonding.

FIG. 2 is a perspective view of the bonded layers of the invention forming a module.

FIG. 3 is a view of the module of the invention with channels being formed on an access plane.

FIGS. 4a, 4b and 4c are various views of the module after channels have been formed by saw-cutting and illustrating the access leads within said channels.

FIG. 5 is a cross-section of the module of the invention showing metalization on the access plane and within the channels.

FIG. 6 is a cross-section of the module of the invention showing a portion of the metalization being removed from the projections.

FIG. 7 is a cross-section of the invention after grinding and showing metalization remaining in the defined channels.

FIG. 8 is a cross-section along a channel of the module of the invention illustrating a T-connect formed within the defined channel.

FIG. 9 shows a surface of a module of the invention illustrating an exemplar complex channel geometry formed using an end mill device.

FIG. 10 is a cross section of a prepackaged TSOP showing a channel formed in the upper surface of the TSOP for the electrical rerouting of a signal from the internal die and wire ball bond to a predetermined location on the TSOP.

DETAILED DESCRIPTION OF THE PREFERRED EMBODIMENT

Referring now to the drawings wherein like numerals designate like elements among the several views, FIGS. 1 and 2 show a preferred embodiment of the present invention. Two or more layers 1 each containing at least one integrated circuit die 2, such as a TSOP or other integrated circuit-containing layer, are bonded together using a suitable adhesive 3 to form a stack 4 of a plurality of layers 1.

It is to be specifically noted that layers 1 may also be comprised of one or more encapsulated integrated circuit die with suitable rerouting of I/O signals from the pads of the integrated circuit die to the edge of the layers, referred to herein as neo-layers, as is disclosed in the above referenced U.S. patents.

An alternative embodiment, layer 1 comprises a modified prepackaged integrated circuit, such as is disclosed in U.S. Pat. No. 6,706,971 to Albert, which patent is incorporated filly herein by reference.

In a further alternative embodiment, layer 1 comprises a modified thin small outline package, or TSOP, wherein one or more edges of the TSOP are modified to expose the internal lead frame for use as an access lead.

In yet a further alternative embodiment, layer 1 comprises a ball grid array (BGA) package bonded and interconnected to an interposer layer, such as a PCB, for the rerouting of the I/O of the BGA to one or more edges of layer 1

As is seen in FIG. 2, one or more planar surfaces are defined on stack 4, referred to herein as an access plane or planes 5 where a plurality of access leads 6 terminate, which access leads are electrically connected to the I/O pads of integrated circuit die 2.

In a preferred embodiment, sets of access leads 6 which are to be interconnected are in substantial vertical alignment on access plane 5. According to the present invention, access leads 6 will be electrically interconnected to form a stacked, integrated microelectronic module as is further discussed below.

As illustrated in FIG. 3, after stacking, one or more linear grooves or channels of a predetermined width and depth are defined along the vertical centerline of the aligned access leads 6, such as by saw-cutting, routering or milling. The width of the channels is preferably slightly greater than the width of access leads 6, resulting in one or more channels 7 and projections 8. Channels 7 are readily formed using a dicing saw as is common in the electronic packaging industry. The channeling process creates multiple recessed surfaces on access plane 5, the innermost recessed portions of channels 7 including access leads 6 to be interconnected.

FIGS. 4a, 4b and 4c illustrate the resultant projection and channel configuration after saw-cutting.

The above exemplar embodiment illustrates the definition of simple, linear channels but, as will be discussed, complex channel geometries are within the scope of the claimed invention, such as channel structures created by a CNC end mill device.

The next processing step is seen in the cross-section shown in FIG. 5, where each access lead 6 in each channel 7 on access plane 5 is initially electrically interconnected, such as by sputtering a metalization layer over the entire surface of access plane 5, including all channel surfaces, to form a metalization layer 9. This initial metalization step effectively electrically shorts all access leads 6 on access plane 5.

As is illustrated in FIG. 6, the outermost surface of projections 8 on access plane 5 are lapped or ground to remove the metalization layer 9 from the projections 8, thereby exposing the insulating plastic encapsulation material of the underlying integrated circuit-containing layer 1.

As further illustrated in FIG. 7, the selective removal of all metalization layer 9 from projections 8 on access plane 5 results in metalization remaining within channels 7 and the electrically interconnection of individual access leads 6 within each channel 7. In this manner there is an electrical isolation of the sets of interconnected access leads 6, within the individual channels 7.

As FIG. 8 illustrates, remaining metalization 9 forms an electrically conductive T-interconnection structure 10 or "T-connect," between access leads 6 for the interconnection of same In this manner, preselected sets of access leads in a stack of integrated circuit-containing layers may be interconnected in a process that is efficient, low in cost and highly reliable.

In one of the alternative embodiments discussed above, stacked ball grid array packages are formed with interposer layers for the routing of the ball connections of the package to the access plane to form access leads. Such a device is disclosed in the copending application to common assignee Irvine Sensors Corp., Ser. No. 10/360,244, now allowed, entitled "Stackable Layers Containing Ball Grid Array Packages", which is fully incorporated herein by reference.

In like manner as set forth above, channels are created on the access plane so as to expose preselected sets of access leads existing on the interposer at the access plane. The entire surface of the access plane, including interior surfaces of each channel, are metalized and lapped or ground to form the desired T-connects 10.

It should be noted that the above method of forming a channeled T-connect may be used in any multi-layer structure where access leads exist on an access plane, which access leads require electrical interconnection.

As illustrated in FIG. 9, complex, non-linear channel geometries can be defined, using, by means of example and not limitation, a printed circuit board plotter, such as a ProtoMAT S62®, available from LPFK Laser & Electronics. Very narrow and accurate channels can be defined on a module surface using end mill tools or equivalent, with the above plotter, such as an 8-12 mil diameter universal mill tool or a 6 mil diameter end mill. An additional benefit of the use of printed circuit board CNC equipment is that multiple modules can be processed at one time using appropriate tooling for the registration and stabilization of modules during the channel cutting process.

The use of a device like an end mill printed circuit board plotter for creating channels further provides the ability to define a channel on any surface of a module or, as illustrated in FIG. 10, upon the upper surface 11 of an encapsulated, prepackaged part 12, such as a TSOP, whereby the individual ball bonds 13 contained disposed upon die 2 and within the encapsulation material 15 are exposed in a channel formed by the milling tool and the channel is routed to a predefined location, such as the edge of the TSOP.

In this manner, surfaces of individual layers of prepackaged parts can be channeled, metalized, lapped, then stacked and bonded into a module. The metallized channels are then interconnected on the surface of the module as disclosed above, providing a low-cost means of providing a stackable layer for use in the disclosed invention.

Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by the following claims. For example, notwithstanding the fact that the elements of a claim are set forth below in a certain combination, it must be expressly understood that the invention includes other combinations of fewer, more or different elements, which are disclosed in above even when not initially claimed in such combinations.

The words used in this specification to describe the invention and its various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements in the claims below or that a single element may be substituted for two or more elements in a claim. Although elements may be described above as acting in certain combinations and even initially claimed as such, it is to be expressly understood that one or more elements from a claimed combination can in some cases be excised from the combination and that the claimed combination may be directed to a subcombination or variation of a subcombination.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements. The claims are thus to be understood to include what is specifically illustrated and described above, what is conceptually equivalent, what can be obviously substituted and also what essentially incorporates the essential idea of the invention.

The invention clamed is:

1. An electronic module comprising:
at least two thin small outline packages, wherein each of the thin small outline packages include at least one integrated circuit die and an internal lead frame configured to route at least one I/O pad from the said integrated circuit die to a first edge of each of the thin small outline packages, and wherein the internal lead frame defines at least one access lead embedded in each of the thin small outline packages at the first edge;
wherein the thin small outline packages are bonded together to define an outer access plane on one outer side of the thin small outline packages, wherein the outer access plane has at least one channel defined thereon, and wherein the channel filled with metallization that is flat and level with the outer access plane; and
wherein the access leads extend toward the access plane and are disposed at the channel, and wherein each of the access leads at the channel are connected to the metallization to establish electrical connection with the others of the access leads at the channel.

2. The electronic module of claim 1, wherein the channel is of a non-linear geometry.

3. The electronic module of claim 1, wherein the channel is defined on an edge surface of at least one of the thin small outline packages.

4. The electronic module of claim 1, wherein the channel is defined on an upper surface of at least one of the thin small outline packages.

5. The electronic module of claim 1, further comprising at least one neolayer.

6. The electronic module of claim 1, wherein the channel is electrically connected to at least one of the access leads by a T-connect structure.

7. An electronic module comprising:
at least two thin small outline packages (TSOPs), wherein each of the TSOPs includes an integrated circuit and a lead frame configured to electrically connect an I/O pad of the integrated circuit to an access lead at a first edge of the corresponding TSOP, and wherein the at least two TSOPs are bonded together to define an outer access plane on an outer side of the at least two TSOPs; and
a channel formed in the outer access plane, wherein, the channel is filled with a conductor to a level corresponding to a surface of the outer access plane, and wherein the channel is configured to electrically connect the at least two TSOPs via the access leads for each of the at least two TSOPs.

8. The electronic module of claim 5, wherein the access leads for each of the at least two TSOPs are substantially aligned with each other.

9. The electronic module of claim 5, further comprising a neolayer having a second access lead electrically connected to the channel.

10. The electronic module of claim 5, wherein the channel has a non-linear geometry.

11. The electronic module of claim 5, wherein a first width of the channel is greater than a second width of the access leads for each of the at least two TSOPs.

12. The electronic module of claim 5, wherein the channel is electrically connected to at least one of the access leads by a T-connect structure.

13. An electronic module comprising:
a first thin small outline package (TSOP) including a first integrated circuit and a first internal lead frame configured to electrically connect a first I/O pad of the first integrated circuit to a first access lead at a first edge of the first TSOP;
a second TSOP bonded to the first TSOP, wherein the second TSOP includes a second integrated circuit and a second internal lead frame configured to electrically connect a second I/O pad of the second integrated circuit to a second access lead at a second edge of the second TSOP; and
a channel configured to electrically connect the first access lead and the second access lead, wherein the channel is formed in and exposed on a first surface of the electronic module, and wherein the channel is filled with a conductor to a level corresponding to the first surface of the electronic module.

14. The electronic module of claim 13, wherein the first access lead and the second access lead are substantially vertically aligned.

15. The electronic module of claim 13, further comprising a neolayer including a third integrated circuit and a rerouted lead configured to electrically connect a third I/O pad of the third integrated circuit to a third access lead at a third edge of the neolayer, and wherein the third access lead is electrically connected to the channel.

16. The electronic module of claim 13, wherein the channel has a non-linear geometry.

17. The electronic module of claim 13, wherein a width of the channel is greater than a width of the first access lead or a width of the second access lead.

18. The electronic module of claim 13, wherein the channel is electrically connected to at least one of the first access lead or the second access lead by a T-connect structure.

19. An electronic module comprising:
a first neolayer including a first integrated circuit and a first rerouted lead configured to electrically connect a first I/O pad of the first integrated circuit to a first access lead at a first edge of the first neolayer;
a second neolayer bonded to the first neolayer, wherein the second neolayer includes a second integrated circuit and a second rerouted lead configured to electrically connect a second I/O pad of the second integrated circuit to a second access lead at a second edge of the second neolayer; and a channel configured to electrically connect the first access lead and the second access lead, wherein the channel is formed in and exposed on a first surface of the electronic module, and wherein the channel is filled with a conductor to a level corresponding to the first surface of the electronic module.

20. The electronic module of claim 19, wherein the channel has a non-linear geometry.

21. The electronic module of claim 19, wherein a width of the channel is greater than a width of the first access lead or a width of the second access lead.

22. The electronic module of claim 19, further comprising at least one T-connect structure configured to electrically connect at least one of the first access lead or the second access lead to the channel.

23. The electronic module of claim 19, wherein the first integrated circuit of the first neolayer is encapsulated.

* * * * *